(12) United States Patent
Chen

(10) Patent No.: US 11,332,661 B2
(45) Date of Patent: May 17, 2022

(54) MODIFIED PEROVSKITE QUANTUM DOT MATERIAL, FABRICATING METHOD THEREOF, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Xu Chen, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 354 days.

(21) Appl. No.: 16/630,443

(22) PCT Filed: Oct. 12, 2019

(86) PCT No.: PCT/CN2019/110731
§ 371 (c)(1),
(2) Date: Jan. 12, 2020

(87) PCT Pub. No.: WO2021/046956
PCT Pub. Date: Mar. 18, 2021

(65) Prior Publication Data
US 2021/0071072 A1    Mar. 11, 2021

(30) Foreign Application Priority Data

Sep. 9, 2019  (CN) .......................... 201910864997.8

(51) Int. Cl.
*C09K 11/02*  (2006.01)
*H01L 51/00*  (2006.01)
(Continued)

(52) U.S. Cl.
CPC .............. *C09K 11/025* (2013.01); *C07F 7/04* (2013.01); *C09K 11/665* (2013.01);
(Continued)

(58) Field of Classification Search
CPC .................................................. H01L 51/5056
See application file for complete search history.

(56) References Cited

U.S. PATENT DOCUMENTS

2017/0260218 A1   9/2017  Koh
2019/0148602 A1   5/2019  Mu et al.

FOREIGN PATENT DOCUMENTS

| CN | 106634961 A | 5/2017 |
|----|-------------|--------|
| CN | 106830060 A | 6/2017 |
| CN | 107219574 A | 9/2017 |
| CN | 107474821 A | 12/2017 |
| CN | 107557004 A | 1/2018 |
| CN | 108219771 A | 6/2018 |

(Continued)

*Primary Examiner* — Yu-Hsi D Sun
(74) *Attorney, Agent, or Firm* — Mark M. Friedman

(57) ABSTRACT

A modified perovskite quantum dot material, a fabricating method thereof, and a display device are provided. Hydroxyl-modified perovskite quantum dots are obtained by adding an excess amount of hydroxyl-containing surface ligands to a solution of synthesized perovskite quantum dots. After high-speed centrifugation, the obtained perovskite quantum dots are redispersed into a non-polar alkyl solvent to form a solution. Further, an excess amount of ethyl orthosilicate is added to the solution, and after exposing the solution for a long period of time, the ethyl orthosilicate is hydrolyzed to form a triethoxysilane group. After centrifugation, modified perovskite quantum dots wrapped by the triethoxysilane groups are obtained, which effectively improves stability of the perovskite quantum dots.

10 Claims, 1 Drawing Sheet

(51) Int. Cl.
*C07F 7/04* (2006.01)
*C09K 11/66* (2006.01)
*B82Y 20/00* (2011.01)
*B82Y 40/00* (2011.01)
*H01L 51/56* (2006.01)
*H01L 51/50* (2006.01)
*H01L 51/52* (2006.01)

(52) U.S. Cl.
CPC .......... *H01L 51/0094* (2013.01); *B82Y 20/00* (2013.01); *B82Y 40/00* (2013.01); *H01L 51/0007* (2013.01); *H01L 51/0028* (2013.01); *H01L 51/502* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/56* (2013.01); *H01L 2251/301* (2013.01); *H01L 2251/308* (2013.01)

(56) References Cited

FOREIGN PATENT DOCUMENTS

| | | | |
|---|---|---|---|
| CN | 108441211 | A | 8/2018 |
| CN | 108587176 | A | 9/2018 |
| CN | 108728077 | A | 11/2018 |
| CN | 108929671 | A | 12/2018 |
| CN | 109004091 | A | 12/2018 |
| CN | 109266343 | A | 1/2019 |
| CN | 109678728 | A | 4/2019 |
| CN | 110028950 | A | 7/2019 |
| CN | 110079313 | A | 8/2019 |

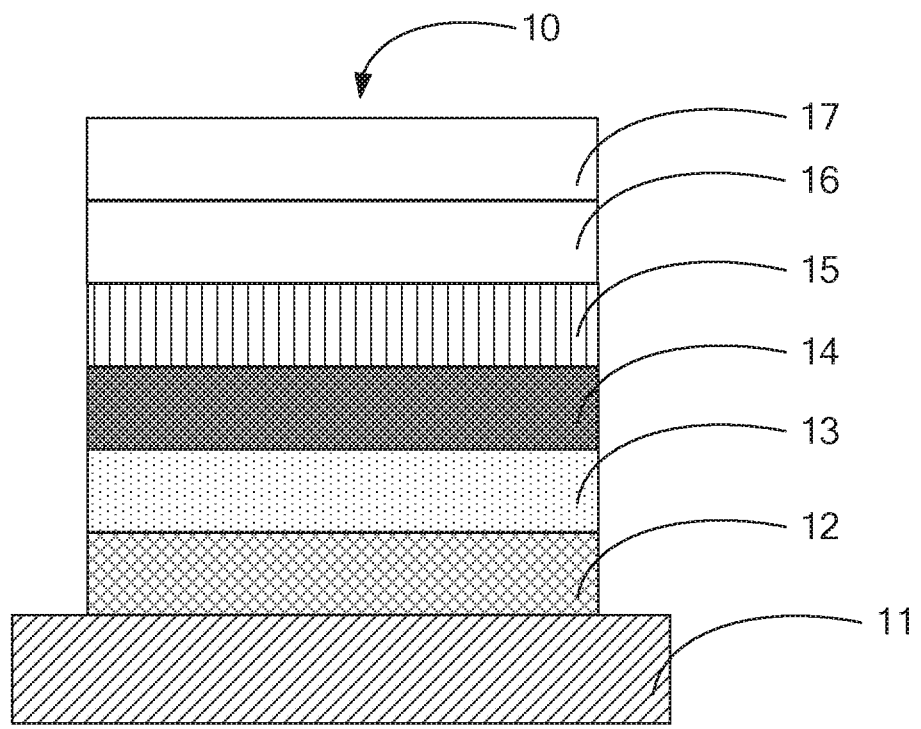

MODIFIED PEROVSKITE QUANTUM DOT MATERIAL, FABRICATING METHOD THEREOF, AND DISPLAY DEVICE

FIELD OF DISCLOSURE

The present disclosure relates to quantum dot luminescent materials, and more particularly to a modified perovskite quantum dot material, a fabricating method thereof, and a display device.

BACKGROUND OF DISCLOSURE

Quantum dots are considered to be another large display technology material after liquid crystal displays (LCD) and organic light emitting diodes (OLEDs), due to excellent thermal stability, high quantum efficiency, narrow half-peak width, and high color gamut thereof. A quantum dot material has a quantum size effect. As particle size changes, a system spectrum can be moved. Finally, a range of visible light can be fully adjusted, and even ultraviolet light and near infrared light can be achieved and efficiency is high. Currently, all major companies have quantum dot products in markets.

Perovskite quantum dots are hot materials in recent years. They have excellent electrical properties such as fast electron transfer rate, large exciton binding energy, long diffusion distance, and they have optical properties such as very high fluorescence quantum efficiency. In recent years, they have been widely used in research on solar cells, lasers, light emitting diodes (LEDs), flat panel displays, etc., and have achieved great scientific and technological breakthroughs. Although the perovskite quantum dots have very good photoelectric properties, their stability is poor, and it is easy to decompose when they encounters a polar solvent, which greatly limits their application effects.

Therefore, it is urgent to provide a new perovskite quantum dot material to improve stability of the perovskite quantum dots.

SUMMARY OF DISCLOSURE

The disclosure provides a modified perovskite quantum dot material, which is used to solve problems that the perovskite quantum dots have poor stability and are easily decomposed in polar solvents.

To solve the above problems, the present disclosure provides a modified perovskite quantum dot material comprising a molecular structural formula as follows:

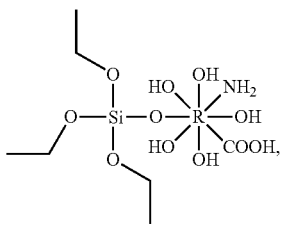

wherein R in the molecular structural formula is a perovskite quantum dot.

Further, the perovskite quantum dot is lead lanthanum halide and has a molecular formula comprising: $CsPbX_3$, $CsPb_2Y_5$ or $Cs_4PbZ_6$, wherein X, Y, and Z are any one of Cl, Br, and Cl.

The present disclosure further provides a fabricating method used to fabricate a modified perovskite quantum dot material, comprising steps of: providing a perovskite quantum dot solution and surface ligands, each of the surface ligands having a hydroxyl group; adding an excess amount of the surface ligands to the perovskite quantum dot solution, and heating and stirring the perovskite quantum dot solution and the excess amount of the surface ligands to obtain a first mixed solution; centrifuging the first mixed solution to obtain quantum dots, wherein a hydroxyl group is on a surface of each of the quantum dots, and redispersing the quantum dots into a non-polar alkyl solvent to obtain a second mixed solution; adding an excess amount of a silicate ester solution to the second mixed solution, and standing the second mixed solution for a preset time to obtain a third mixed solution; and centrifuging the third mixed solution to obtain the modified perovskite quantum dot material.

Further, the silicate ester solution is a tetraethyl orthosilicate solution, and the non-polar solvent includes at least one of n-hexane, dodecane, octadecane, or squalane.

Further, the step of adding the excess amount of the silicate ester solution to the second mixed solution comprises a step of: hydrolyzing the silicate ester solution to obtain triethoxysilane for forming a triethoxysilane group on a surface of the modified perovskite quantum dot.

Further, in the step of adding the excess amount of the surface ligands to the perovskite quantum dot solution, a heating temperature ranges from 45 to 55° C., and a stirring time ranges from 30 to 60 minutes.

Further, the step of providing the perovskite quantum dot solution comprises: providing a lanthanum oleate solution, a lead halide solid, and a ligand solvent; dissolving the lead halide solid in the ligand solvent to form a ligand solution; and adding the ligand solution to the lanthanum oleate solution to form the perovskite quantum dot solution, wherein the ligand solvent comprises an oleylamine solution or an oleic acid solution; and the lead halide solid comprises any one or more combinations of $PbCl_2$, $PbBr_2$, and $PbI_2$.

The present disclosure provides a display device comprising the modified perovskite quantum dot material.

Further, the display device comprises: a first electrode; a hole injection layer disposed on the first electrode; a hole transport layer disposed on the electron injection layer; a quantum dot luminescent layer disposed on the hole transport layer, wherein a material used for the quantum dot luminescent layer comprises the modified perovskite quantum dot material; an electron transport layer disposed on the quantum dot luminescent layer; an electron injection layer disposed on the electron transport layer; and a second electrode disposed on the electron injection layer.

Further, the first electrode is an anode, and a used material of the first electrode is indium tin oxide; and the second electrode is a cathode, and a used material of the second electrode is one of lithium fluoride or aluminum.

Beneficial effects of the present disclosure are that: the present disclosure provides a modified perovskite quantum dot material, a fabricating method thereof, and a display device. Hydroxyl-modified perovskite quantum dots are obtained by adding an excess amount of hydroxyl-containing surface ligands to a solution of synthesized perovskite quantum dots. After high-speed centrifugation, the obtained perovskite quantum dots are redispersed into a non-polar alkyl solvent to form a solution. Further, an excess amount of ethyl orthosilicate is added to the solution, and after exposing the solution for a long period of time, the ethyl orthosilicate is hydrolyzed to form a triethoxysilane group. After centrifugation, modified perovskite quantum dots wrapped by the triethoxysilane groups are obtained, which effectively improves stability of the perovskite quantum dots.

DESCRIPTION OF DRAWINGS

The present disclosure will now be further described with reference to the following drawings and embodiments.

FIG. 1 is a structural cross-sectional diagram showing a display device of the present disclosure.
display device 10;
first electrode 11; hole injection 12; hole transport layer 13; quantum dot luminescent layer 14; electron transport layer 15; electron injection layer 16;
second electrode 17

DETAILED DESCRIPTION OF PREFERRED EMBODIMENTS

The following description of the various embodiments refers to the accompanying drawings, which are intended to illustrate specific embodiments of the present disclosure. Directional terms mentioned in the present disclosure, such as upper, lower, front, rear, left, right, inner, outer, side, etc., are merely directions referring to the drawings. The terms of the elements mentioned in the present disclosure, such as first, second, etc., are only used to differentiate between different components for better expressive. In the drawings, structurally similar elements are denoted by same reference numerals.

Embodiments of the present disclosure will be described in detail herein with reference to the drawings. The present disclosure may be embodied in many different forms and the disclosure is not to be construed as being limited to the specific embodiments set forth herein. The present disclosure is provided to explain the practical application of the present disclosure, so that those skilled in the art can understand various embodiments of the present disclosure and various modifications suitable for the specific intended application.

The present disclosure provides a modified perovskite quantum dot material comprising a molecular structural formula as follows:

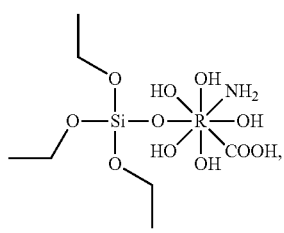

wherein R in the molecular structural formula is a perovskite quantum dot.

The modified perovskite quantum dot has a triethoxysilane structure, which effectively improves stability of the modified perovskite quantum dot.

The perovskite quantum dot is lead lanthanum halide and has a molecular formula comprising: $CsPbX_3$, $CsPb_2Y_5$ or $Cs_4PbZ_6$, wherein X, Y, and Z are any one of Cl, Br, and Cl.

In order to more clearly explain the present disclosure, the modified perovskite quantum dot material is further explained below in connection with the fabricating method of a modified perovskite quantum dot material of the present disclosure.

The fabricating method of the present disclosure is used for fabricating the modified perovskite quantum dot material and comprises the following steps S1 to S5.

In step S1, a perovskite quantum dot solution and surface ligands are provided, wherein each of the surface ligands has a hydroxyl group.

Before the step of providing the perovskite quantum dot solution, the perovskite quantum dot solution is fabricated by steps of: providing a lanthanum oleate solution, a lead halide solid, and a ligand solvent; dissolving the lead halide solid in the ligand solvent to form a ligand solution; adding the ligand solution to the lanthanum oleate solution to form the perovskite quantum dot solution.

The ligand solvent includes, but is not limited to, an oleylamine solution and an oleic acid solution; the lead halide solid comprises any one or more combinations of $PbCl_2$, $PbBr_2$, and $PbI_2$.

The perovskite quantum dots in the perovskite quantum dot solution provided by the disclosure have various kinds, such as the perovskite quantum dots, including but not limited to $CsPbX_3$ (X can be selected from at least one of Cl, Br, and I), $CsPb_2Y_5$ (Y can be selected from at least one of Cl, Br, and I), $Cs_4PbZ_6$ (Z can be selected from at least one of Cl, Br, and I), wherein X, Y, and Z can not simultaneously exhibit Cl halogen and I halogen.

In step S2, an excess amount of the surface ligands is added to the perovskite quantum dot solution, and the perovskite quantum dot solution and the excess amount of the surface ligands are heated and stirred to obtain a first mixed solution. A heating temperature ranges from 45 to 55° C., preferably 50° C., and of course 48° C. or 55° C. is acceptable. A stirring time ranges from 30 to 60 minutes, preferably 40 minutes, and of course 35, 45 OR 55 minutes is acceptable in other embodiments.

The hydroxyl-containing surface ligand includes an oil-soluble ligand and a water-soluble ligand. The water-soluble ligand comprises thioglycolic acid. The oil-soluble ligand comprises octadecanoic acid or octadecyl phosphate.

In step S3, the first mixed solution is centrifuged to obtain quantum dots, wherein a hydroxyl group is on a surface of each of the quantum dots, and the quantum dots are redispersed into a non-polar alkyl solvent to obtain a second mixed solution.

The non-polar solvent includes at least one of n-hexane, dodecane, octadecane, or squalane.

In step S4, an excess amount of a silicate ester solution is added to the second mixed solution, and the second mixed solution is stood for a preset time to obtain a third mixed solution. The silicate ester solution includes, but is not limited to, a tetraethyl orthosilicate solution.

As shown in FIG. 1, the quantum dot having a hydroxyl group is chemically reacted with the tetraethyl orthosilicate, and the reaction equation is as follows:

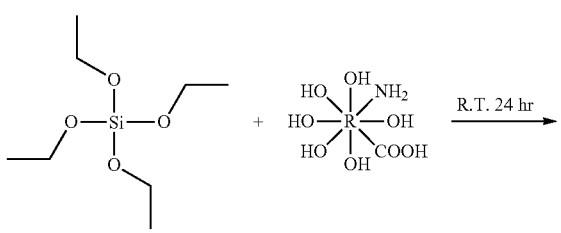

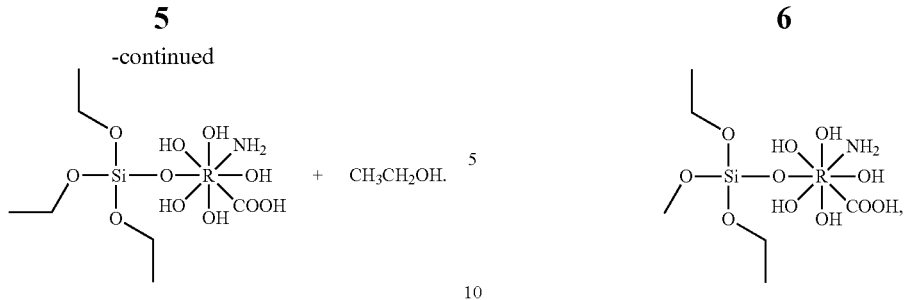

A finally obtained product contains ethanol, which is easy to volatilize, and a relatively few by-products can be obtained. Further, the reaction further comprises that the silicate ester solution is hydrolyzed to obtain triethoxysilane for forming a triethoxysilane group on a surface of the modified perovskite quantum dot. Specifically, a hydrolysis reaction equation is as follows:

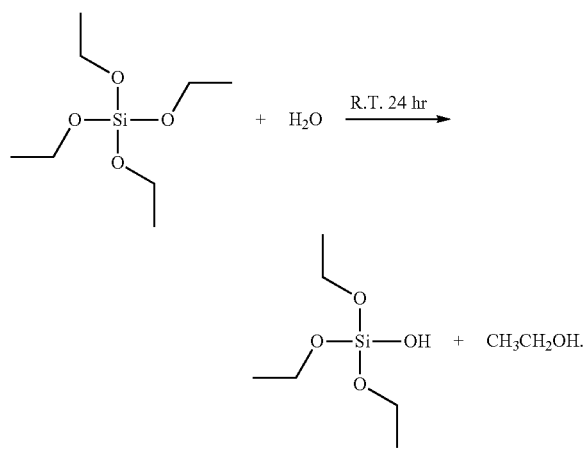

In step S5, the third mixed solution is centrifuged to obtain the modified perovskite quantum dot material. A surface of the modified perovskite quantum dot material has a triethoxysilane group.

It has been experimentally proved that stability of the modified perovskite quantum dots is effectively improved. In order to apply the modified perovskite quantum dots to a luminescent device, the present disclosure also provides a display device comprising the modified perovskite quantum dot material.

Specifically, as shown in FIG. 1, the display device 10 comprises a first electrode 11, a hole injection layer 12, a hole transport layer 13, a quantum dot luminescent layer 14, an electron transport layer 15, an electron injection layer 16, and a second electrode 17.

The hole injection layer 12 is disposed on the first electrode 11. The hole transport layer 13 is disposed on the hole injection layer 12. The quantum dot luminescent layer 14 is disposed on the hole transport layer 13, wherein a material used for the quantum dot luminescent layer 14 is the modified perovskite quantum dot material. The electron transport layer 15 is disposed on the quantum dot luminescent layer 14. The electron injection layer 16 is disposed on the electron transport layer 15. The second electrode 17 is disposed on the electron injection layer 16.

The modified perovskite quantum dot material in the quantum dot luminescent layer 14 has a molecular structural formula as follows:

wherein R in the molecular structural formula is a perovskite quantum dot.

The modified perovskite quantum dot has a triethoxysilane structure, which effectively improves stability of the modified perovskite quantum dot.

The perovskite quantum dot is lead lanthanum halide and has a molecular formula comprising: $CsPbX_3$, $CsPb_2Y_5$ or $Cs_4PbZ_6$, wherein X, Y, and Z are any one of Cl, Br, and Cl.

In present embodiment, the first electrode 11 is an anode, and a used material of the first electrode 11 is indium tin oxide; and the second electrode 17 is a cathode, and a used material of the second electrode 17 is one of lithium fluoride or aluminum.

In the display device 10 of the present disclosure, the modified perovskite quantum dot material is used in the quantum dot luminescent layer 14, so as to efficiently fabricate the display device, thereby improving luminance stability of the display device.

It should be noted that various modifications and adaptations of the present disclosure are possible without departing from the specific embodiments of the embodiments described above. The above embodiments are merely illustrative of the disclosure and are not intended to limit the disclosure. From above, the scope of the present disclosure should include such modifications or substitutions and adaptations as would be apparent to those skilled in the art.

The invention claimed is:

1. A modified perovskite quantum dot material, comprising a molecular structural formula as follows:

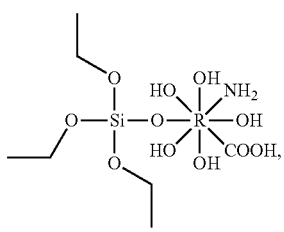

wherein R in the molecular structural formula is a perovskite quantum dot.

2. The modified perovskite quantum dot material according to claim 1, wherein the perovskite quantum dot is lead lanthanum halide and has a molecular formula comprising: $CsPbX_3$, $CsPb_2Y_5$ or $Cs_4PbZ_6$, wherein X, Y, and Z are any one of Cl, Br, and Cl.

3. A fabricating method used to fabricate a modified perovskite quantum dot material according to claim 1, comprising steps of:

providing a perovskite quantum dot solution and surface ligands, each of the surface ligands having a hydroxyl group;

adding an excess amount of the surface ligands to the perovskite quantum dot solution, and heating and stirring the perovskite quantum dot solution and the excess amount of the surface ligands to obtain a first mixed solution;

centrifuging the first mixed solution to obtain quantum dots, wherein a hydroxyl group is on a surface of each of the quantum dots, and redispersing the quantum dots into a non-polar alkyl solvent to obtain a second mixed solution;

adding an excess amount of a silicate ester solution to the second mixed solution, and standing the second mixed solution for a preset time to obtain a third mixed solution; and centrifuging the third mixed solution to obtain the modified perovskite quantum dot material.

4. The fabricating method according to claim 3, wherein:
the silicate ester solution is a tetraethyl orthosilicate solution, and
the non-polar solvent includes at least one of n-hexane, dodecane, octadecane, or squalane.

5. The fabricating method according to claim 3, wherein:
the step of adding the excess amount of the silicate ester solution to the second mixed solution comprises a step of: hydrolyzing the silicate ester solution to obtain triethoxysilane for forming a triethoxysilane group on a surface of the modified perovskite quantum dot material.

6. The fabricating method according to claim 3, wherein:
in the step of adding the excess amount of the surface ligands to the perovskite quantum dot solution, a heating temperature ranges from 45 to 55° C., and a stirring time ranges from 30 to 60 minutes.

7. The fabricating method according to claim 3, wherein:
the step of providing the perovskite quantum dot solution comprises:

providing a lanthanum oleate solution, a lead halide solid, and a ligand solvent;

dissolving the lead halide solid in the ligand solvent to form a ligand solution; and adding the ligand solution to the lanthanum oleate solution to form the perovskite quantum dot solution, wherein the ligand solvent comprises an oleylamine solution or an oleic acid solution; and the lead halide solid comprises any one or more combinations of $PbCl_2$, $PbBr_2$, and $PbI_2$.

8. A display device, comprising a modified perovskite quantum dot material according to claim 1.

9. The display device according to claim 8, comprising:
a first electrode;
a hole injection layer disposed on the first electrode;
a hole transport layer disposed on the hole injection layer;
a quantum dot luminescent layer disposed on the hole transport layer, wherein a material used for the quantum dot luminescent layer comprises the modified perovskite quantum dot material;
an electron transport layer disposed on the quantum dot luminescent layer;
an electron injection layer disposed on the electron transport layer; and
a second electrode disposed on the electron injection layer.

10. The display device according to claim 9, wherein:
the first electrode is an anode, and a used material of the first electrode is indium tin oxide; and the second electrode is a cathode, and a used material of the second electrode is one of lithium fluoride or aluminum.

* * * * *